United States Patent [19]

Takahashi et al.

[11] Patent Number: 5,246,468
[45] Date of Patent: Sep. 21, 1993

[54] METHOD OF FABRICATING A LATERAL METAL-INSULATOR-METAL DEVICE COMPATIBLE WITH LIQUID CRYSTAL DISPLAYS

[75] Inventors: Kotoyoshi Takahashi; Takeyoshi Ushiki, both of Suwa, Japan

[73] Assignee: Seiko Epson Corporation, Tokyo, Japan

[21] Appl. No.: 726,072

[22] Filed: Jul. 5, 1991

[30] Foreign Application Priority Data

Jul. 6, 1990 [JP] Japan ................................ 2-178702
Dec. 27, 1990 [JP] Japan ................................ 2-414612

[51] Int. Cl.⁵ ............................................. H01L 21/68
[52] U.S. Cl. .................................. 29/25.01; 29/25.02; 437/41; 437/181; 437/229
[58] Field of Search ................ 29/25.01, 25.02; 357/2, 357/71, 45; 359/68, 71, 79; 437/41, 181, 229

[56] References Cited

U.S. PATENT DOCUMENTS

| | | | |
|---|---|---|---|
| 4,683,183 | 7/1992 | Ono | 430/20 |
| 4,929,059 | 5/1990 | Takahashi | 359/79 |
| 4,988,168 | 1/1991 | Dickerson et al. | 359/68 |
| 5,008,732 | 4/1991 | Kondo et al. | 357/71 |
| 5,010,027 | 4/1991 | Possin et al. | 437/41 |
| 5,015,597 | 5/1991 | Vinouze et al. | 437/41 |
| 5,039,204 | 8/1991 | Choi | 359/68 |
| 5,042,917 | 8/1991 | Fujita et al. | 357/2 |

FOREIGN PATENT DOCUMENTS 178320 10/1983 Japan.
009635 1/1984 Japan.
162048 7/1986 Japan.

OTHER PUBLICATIONS

1988 International Display Research Conference, Oct. 1988, pp. 226–229; R. L. Wisnieff et al.: A Lift-Off Process to Build Edge Junction MIM Active Device Arrays.
S. Morozumi et al.: 'A 240×250 element LCD Addressed by Lateral MIM' pp. 404–407, Japan Display, 1983.

*Primary Examiner*—Brian E. Hearn
*Assistant Examiner*—Kevin M. Picardat
*Attorney, Agent, or Firm*—Raymond J. Werner

[57] ABSTRACT

The invention is concerned with a production process for a lateral metal-insulator-metal (MIM) device for use in liquid crystal displays. A conductive pattern is formed on a transparent substrate, followed by formation of a barrier layer insulator on top of the conductive pattern. Positive photoresist is applied and light is passed through the back side of the substrate. The photoresist is developed and the barrier layer insulator is etched until the sides of the conductive pattern are exposed. A thin insulator layer is formed on the exposed sides. The lateral MIM structure is completed with the formation of a second conductive layer, or electrode, over the thin insulator. With the method of this invention, breakage of the electrode does not occur because the underlying conductor is not undercut from etching, as occurs in prior art MIM production processes.

20 Claims, 10 Drawing Sheets

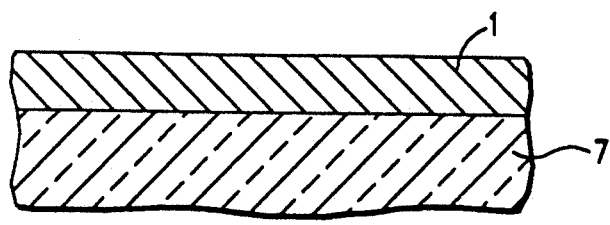
FIG.−1A
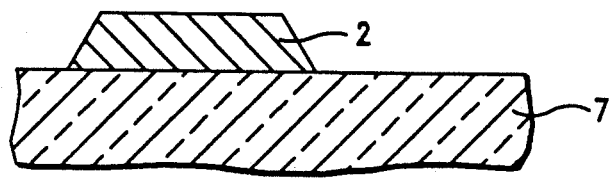
FIG.−1B
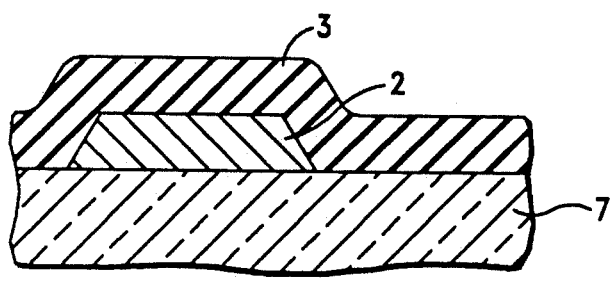
FIG.−1C
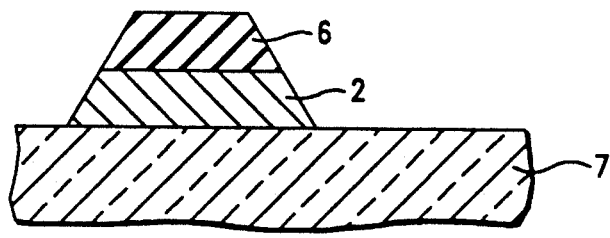
FIG.−1D
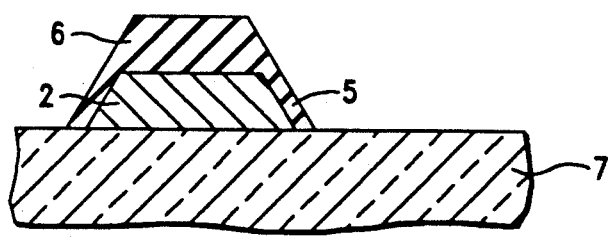
FIG.−1E
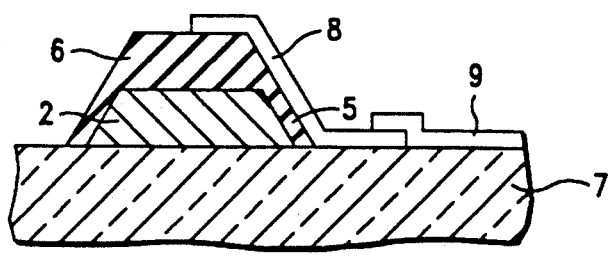
FIG.−1F

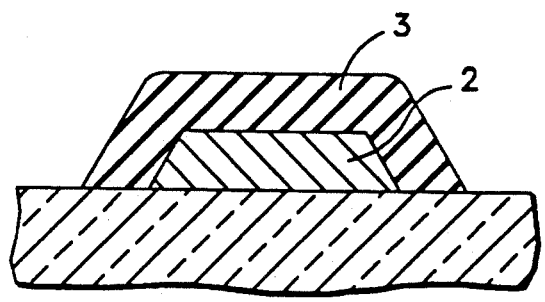
FIG.—4A
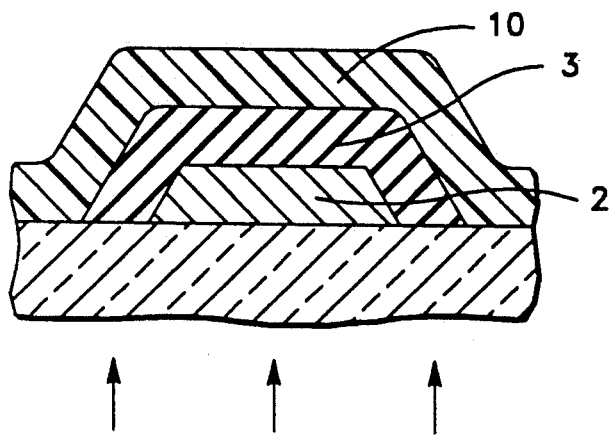
FIG.—4B
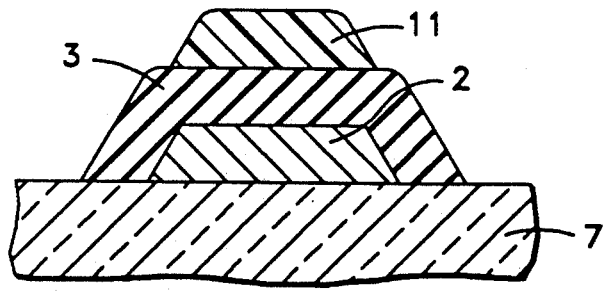
FIG.—4C
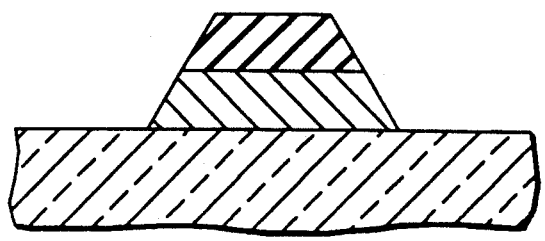
FIG.—4D

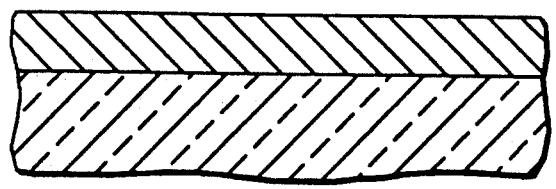
FIG.—11A
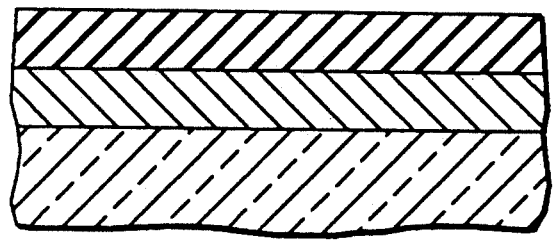
FIG.—11B
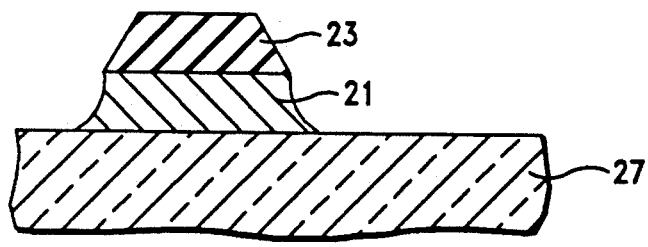
FIG.—11C
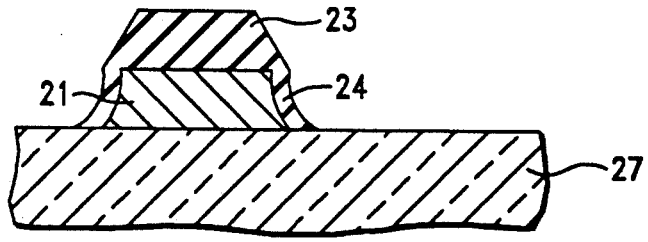
FIG.—11D
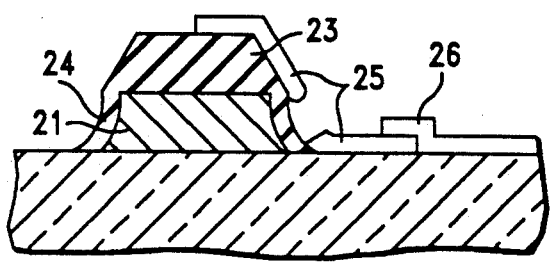
FIG.—11E

METHOD OF FABRICATING A LATERAL METAL-INSULATOR-METAL DEVICE COMPATIBLE WITH LIQUID CRYSTAL DISPLAYS

BACKGROUND OF THE INVENTION

The present invention relates to a method for producing the active elements in liquid crystal displays. More particularly, it relates to a method for producing lateral Metal-Insulator-Metal (MIM) devices for liquid crystal displays.

It is known to incorporate MIMs in liquid crystal displays. FIGS. 8 and 9 show the structure of MIM devices.

FIG. 9, shows an MIM device comprising a transparent substrate 27, a first conductor 21 having side 22, a barrier layer 23, a second conductor 25 and a pixel electrode 26. The electrical resistance of the thick portion of barrier layer 23 has been set high so that it does not function as an MIM device. First conductor 21, second conductor 25 and thin portion of barrier layer 23 along first conductor side 22 form a non-linear MIM device.

By structuring the device in this manner, the surface area of the MIM device can be quite small. This technology is effective in achieving high density in liquid crystal displays.

However, use of MIMs has been hampered by manufacturing problems which result in defective liquid crystal display (LCD) panels. In particular, the problem is that yield is extremely low, making the device impractical. FIGS. 10(a)-(e) and 11(a)-(e) illustrate the MIM manufacturing process flow of the prior art.

FIGS. 10(a)-(e) shows the production steps of the prior used to fabricate a lateral MIM device.

In step (a), the film for first conductor 21 is formed on transparent substrate 27. This includes the formation of a transparent base film.

In step (b), barrier layer 23 is formed on top of first conductor 21.

In step (c), patterning takes place through the simultaneous photo-etching of first conductor 21 and barrier layer 23. Barrier layer 23 will subsequently act as a first thick insulator when the device is fully fabricated.

In step (d), second insulator film 24 is formed on the side of first conductor 21, which was obtained via step (c).

In step (e), second conductor 25 and pixel electrode 26 are each formed and patterned.

The lateral MIM device is formed by first conductor 21, second insulator 24 and second conductor 25.

Well-known conductors used for MIM devices are Ta, Al, Au, ITO, NiCr+Au and ITO+Cr. Well-known insulators that are used for the second insulator are TaOx, SiOx, SiN$_x$, SiOxN$_y$, TaN$_x$ and ZnOx. These second insulators are formed through thermal oxidation or anodic oxidation or through a process such as sputtering.

For the barrier layer, in addition to the inorganic materials used for the second insulator above, organic material such as polyimide may also be used.

The best known structure for an MIM device uses Ta (tantalum) for first conductor 21, TaOx (tantalum oxide) for second insulator 24, and Cr (chromium) for second conductor 25, yielding a Ta/TaOx/Cr structure.

FIGS. 11(a)-(e) correspond to FIGS. 10(a)-(e). In general, the barrier layer 23, whether made from a nitride or an oxide, will have a lower etch rate than first conductor 21. TaOx etches at about half the rate of Tantalum. The etch rate difference between Ta and TaN$_x$ is even greater. As a result, as shown in FIG. 11(c), first conductor 21 takes on an undercut shape.

In subsequent step (d), second insulator 24 (TaOx) is formed.

In step (e), second conductor 25 (Cr) and pixel electrode 26 are formed. However, when forming second conductor 25, there is the drawback that second conductor 25 will be subject to breakage because of the overhang of second insulator 24. Moreover, even if there is no breakage, because the shape, or taper, of the first conductor sides cannot be controlled, there is the problem of not being able to control the surface area of the lateral MIM device.

Failure to control the MIM surface area means that the display condition of the LCD pixel cannot be controlled, and this is a fatal defect.

What is desirable is a process for reliably and uniformly producing a plurality of lateral MIM structures on a substrate such that high yields and predictable performance can be achieved in LCD panels.

SUMMARY OF THE INVENTION

The lateral MIM device manufacturing method of the present invention is a method in which the first conductor, which is on a transparent substrate, the insulator, which is formed on the sides of the first conductor, and the second conductor are stacked together. The stacked portion of the first conductor, the second insulator, and the second conductor become the pixel element for driving the pixel electrode of the LCD.

The manufacturing method for the lateral MIM device is realized by forming a first conductor on a transparent substrate and then applying to the top and sides of the first conductor, a transparent insulator film followed by a positive photoresist. After this, light is introduced from the back side of the transparent substrate. The photoresist is then developed. The transparent insulator is then etched until the sides of the first conductor are exposed. Then, an insulator and the second conductor are formed on the sides, the whole structure forming a lateral MIM.

Alternatively, the present invention may be realized by forming a first conductor on top of a transparent substrate and applying positive photoresist, such as a polyimide which is photosensitive and can also act as an insulator, to the top and sides of the first conductor. After this, light is introduced from the backside of the transparent substrate and then the photoresist is developed. The sides of the first conductor are exposed and an insulator and the second conductor are formed in sequence on the sides, forming a lateral MIM.

Alternatively, the present invention may be realized by forming a first conductor on top of a transparent substrate and applying negative photoresist to the top and the sides of the first conductor. After this, light is introduced from the back of the transparent substrate. The photoresist is then developed. The top of the first conductor is exposed and a insulator is formed on the top. After this, the sides if the first conductor are exposed by removing the photoresist and an insulator and the second conductor are formed on the sides in sequence, forming a lateral MIM.

An advantage of the present invention is the elimination of the first conductor undercut caused by overetching. Elimination of this structural defect eliminates the consequential problems of poor metal step coverage and metal breakage.

A further advantage of the present invention derived from elimination of first conductor undercut is uniform MIM surface area. This is important in establishing uniform brightness across an LCD panel.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 1(a)-(f) show an embodiment of the production method of this invention.

FIGS. 4(a)-(d) show another embodiment of this invention.

FIGS. 11(a)-(e) shows the production method of the liquid crystal display device lateral MIM device of the prior art.

DETAILED DESCRIPTION OF THE INVENTION

Figure 2A:
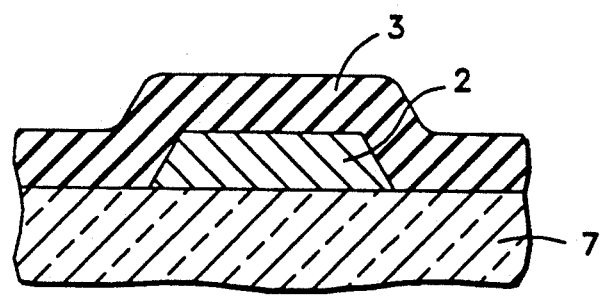
FIGS. 2(a)-(d) show an embodiment of the production method of this invention.

The lateral MIM production process of the present invention will be described with reference to the figures, which illustrate the inventive concept in several embodiments.

Steps (a) through (f) in FIGS. 1(a)-(f) give a general overview of the process. In step (a) Ta film 1 is applied to transparent substrate 7. Transparent substrate 7 has on it a transparent base layer of TaOx prior to formation of Ta film 1.

In step (b), Ta electrode 2 is formed as the first conductor by means of photo-etching. The preferred slope of the electrode sidewalls is 30 degrees. However, the sidewall slope can be adjusted, by means of etching techniques well known to those skilled in the art, in order to increase or decrease the sidewall surface area available for formation of the lateral MIM structure.

In step (c), TaOx layer 3 is formed as a barrier layer on top of transparent substrate 7 and Ta electrode 2. This barrier layer is typically about 3000 Å. The application of a barrier layer in step (c), takes place by applying TaOx layer 3 using a sputtering or a chemical vapor deposition (CVD) process. The process flow is the same even when the barrier layer is made of a material other than TaOx (for example, $TaN_x$ or $SiN_x$).

In step (d), photo-etching takes place in order to leave TaOx 6, which is on top of Ta electrode 2, as the barrier layer. In step (e), a thin TaOx layer 5 is formed as the insulating layer of Ta electrode 2 using anodic oxidation or thermal oxidation. This thin layer is typically about 600 Å. In step (f), the Cr and pixel electrode layers are applied, forming Cr pattern 8 and pixel electrode pattern 9 by means of photo-etching.

Figure 2B:
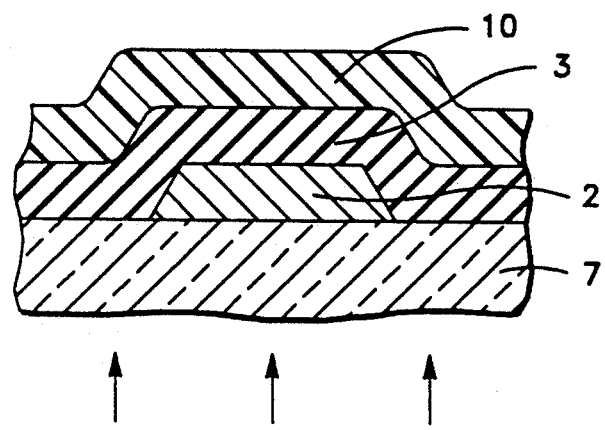

The method of leaving TaOx 6 on Ta electrode 2 as the barrier layer in step (d) of FIG. 1(d) will described using FIGS. 2(a)-(d). FIG. 1(c) corresponds to FIG. 2(a). Positive photoresist 10 is applied to the surface that exists on Ta electrode 2 as indicated in FIG. 2(b). Next, light exposure takes place from the backside of transparent substrate 7. Substrates as large as 300 mm by 350 mm have been used.

Figure 2C:
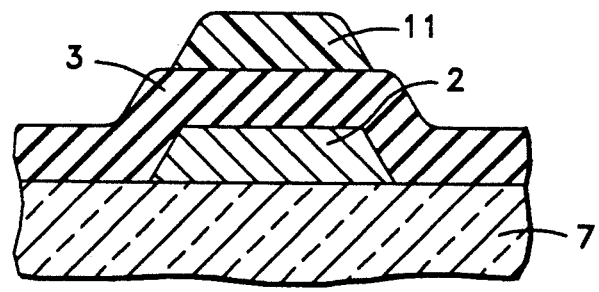
Figure 2D:
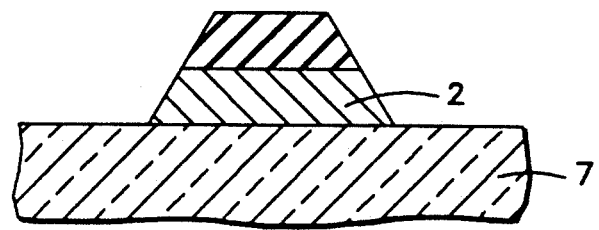

As a result of this, only the positive photoresist on top of Ta electrode 2, is not exposed to light because oxide films and nitride films such as TaOx 3 are transparent to light exposure whereas Ta electrode 2 is a non-transparent layer. Typically over-exposure is used to obtain a smaller pattern than a projection of the masking Ta electrode 2 would give. This is a technique well-known to those skilled in the art. As shown in FIG. 2(c), when the photoresist is developed, only photoresist 11 on top of Ta electrode 2 remains. In this condition, if etching takes place until the sides of Ta electrode 2 are exposed, the structure of FIG. 2(d) will be obtained.

Figure 10A:
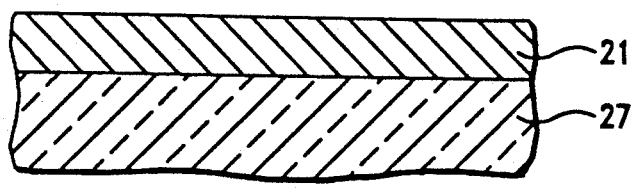
FIGS. 10(a)-(e) shows the production method of the liquid crystal display device lateral MIM device of the prior art.
Figure 10B:
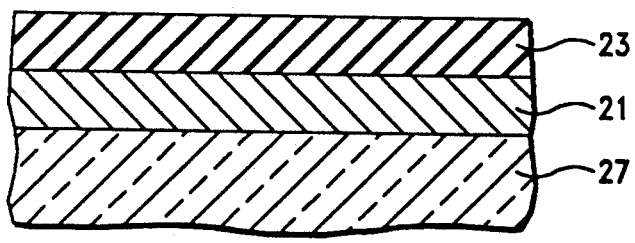
Figure 10C:
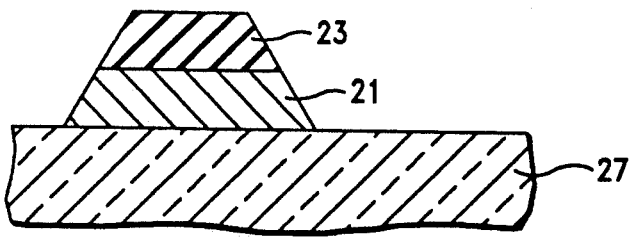
Figure 10D:
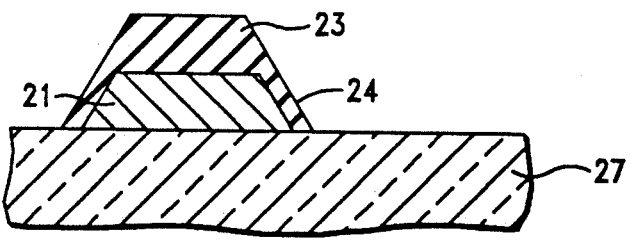
Figure 10E:
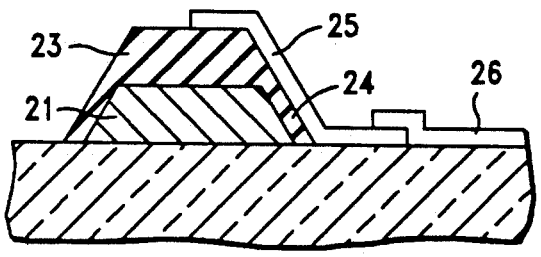

This is different from the situation of the prior art, which is shown in FIG. 10(c). This because the film etched here (as shown in FIG. 2(c)) as indicated above is TaOx 3, which is spread across the entire transparent substrate. Therefore, the etching rate is uniform. As a result, etching can take place in such a manner that the sides of Ta electrode 2 do not have an undercut shape. In addition, the tapered shape of the sides of Ta electrode 2 will already have been formed in step (b) of FIG. 1(b), allowing uniform and excellent side taper to be obtained. As a result of this, Cr electrode pattern 8 will not suffer breakage on the sides of Ta electrode 2. As shown in FIG. 1(f), this will allow for a uniformity of the lateral MIM surface area.

Figure 3A:
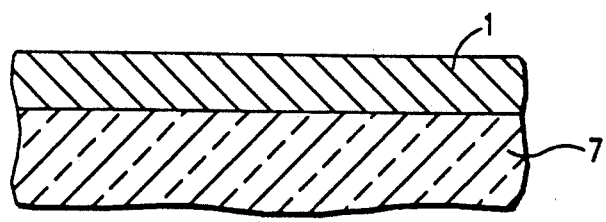
FIGS. 3(a)-(f) show another embodiment of this invention.
Figure 3B:
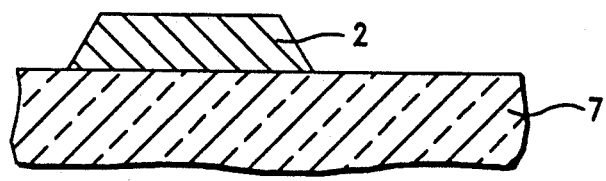
Figure 3C:
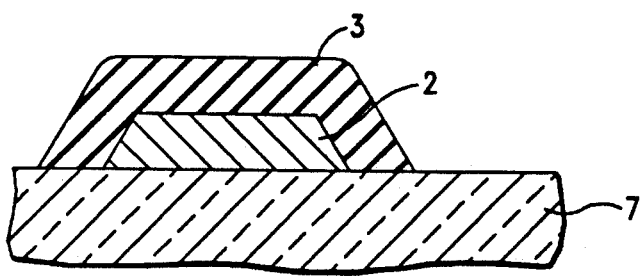

FIGS. 3(a)-(f) show another embodiment of the lateral MIM production method. FIGS. 3(c) and (d) show the characteristic process steps of this embodiment of the present invention. The process steps indicated in FIGS. 4(a) to (d), show the details of processes indicated in FIGS. 3(c) and (d). Steps (a) and (b) of this embodiment are the same as steps shown in FIGS. 1(a) and (b) and discussed above.

In FIG. 1, TaOx layer 3, the barrier layer, was applied on top of transparent substrate 7 and Ta electrode 2. However, in this embodiment, as indicated in FIG. 3(c), TaOx barrier layer 3 was applied only to the top and the sides of Ta electrode 2. It was not applied to transparent substrate 7. Forming the TaOx barrier layer 3 by means of anodic oxidation or thermal oxidation, is much cheaper than methods such as sputtering or CVD.

Figure 3D:
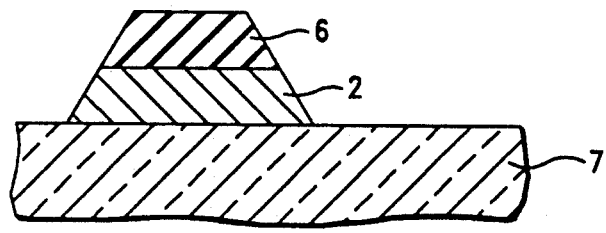
Figure 3E:
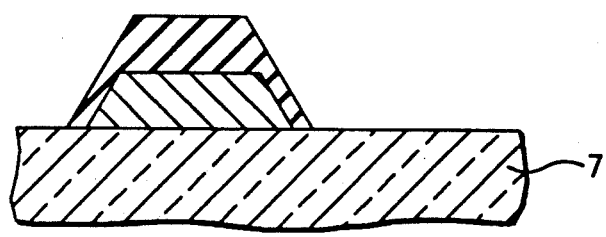
Figure 3F:
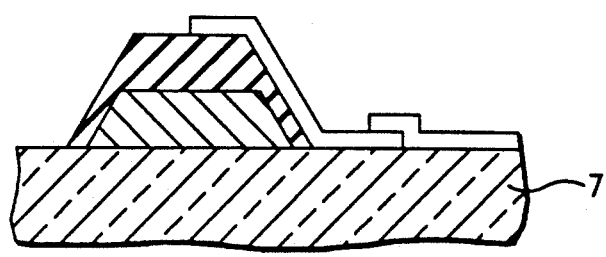

In FIG. 3(d), the method of leaving TaOx barrier layer 3 on the top surface of Ta electrode 2 as TaOx 6, while leaving the electrode sides free of insulator, is shown in FIGS. 4(a)-(d). Basically this is the same process shown in FIG. 2 where light exposure takes place from the back of the substrate. As indicated in FIG. 4 (c), photoresist remains at the top of Ta electrode 2. In step (d) TaOx layer 3 is etched. Because transparent substrate 7 has a strong resistance to the TaOx barrier layer etch, essentially the only film to be etched will be the TaOx film. This process gives the same beneficial structural results as the embodiments shown in FIGS. 1 and 2, and the Cr pattern will not suffer from breakage on the sides of Ta electrode 2.

As is clear from the above embodiments, it is necessary that the film that forms the barrier layer be transparent to the wavelengths of the back light exposure. Transparent barrier films may be formed from inorganic materials such as TaOx, CrOx, $SiN_x$, $TaN_x$, $TaOxN_x$, $SiOxN_x$. However, they may also be organic (polyimide, for instance). The general methods of applying a film are CVD, sputtering, vapor deposition, anodic oxidation, spin coating, and dipping. Although a number of possible methods exist, anodic oxidation is used to implement the present invention.

Figure 5A:
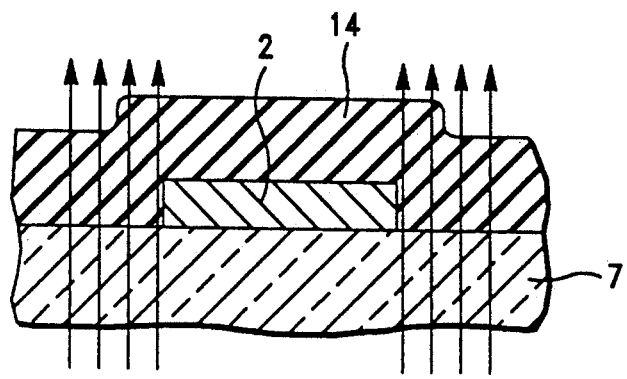
FIGS. 5(a)-(c) show an embodiment that uses positive photoresist as the barrier layer.
Figure 5B:
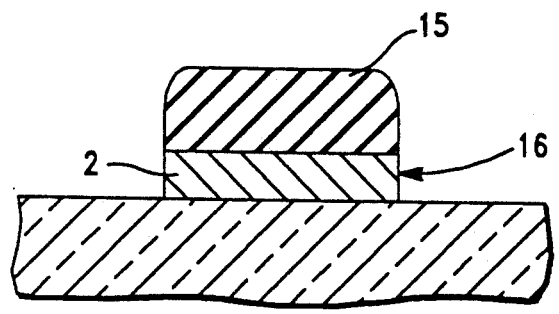
Figure 5C:
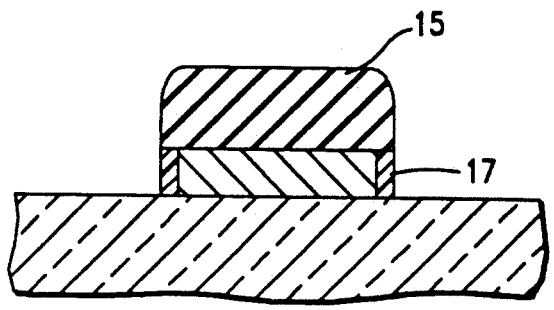
Figure 6A:
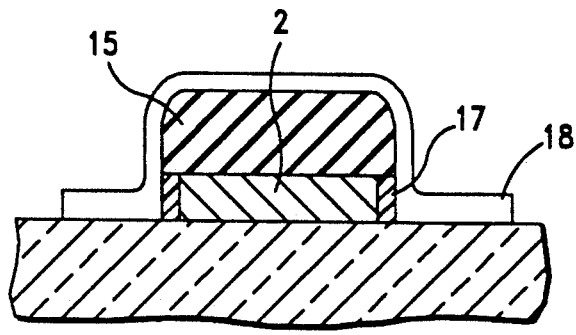
FIGS. 6(a)-(c) show an embodiment that uses positive photoresist as the barrier layer.
Figure 6B:
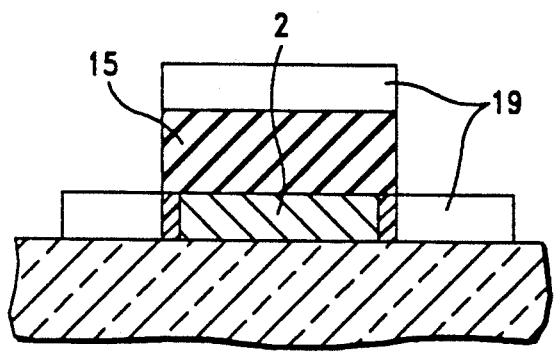
Figure 6C:
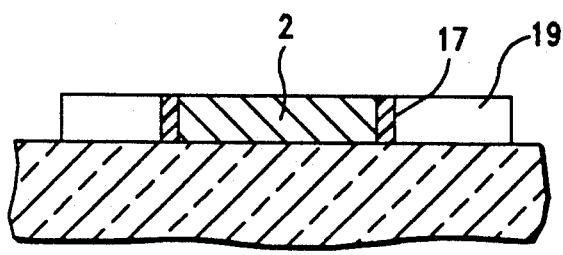

FIGS. 5(a)-(c) and 6(a)-(c) show another embodiment of the present invention. This method uses a positive sensitivity insulator as the barrier layer. Compared to the above embodiments, this method has the advantage of even fewer process steps. FIG. 5(a) is a cross section showing positive sensitivity polyimide 14 applied to the top of Ta electrode 2. In this situation, if light exposure from the substrate backside takes place, inorganic insulator 15 will remain on top of Ta electrode 2 after the positive sensitivity insulator has been developed. Because the sides 16 of Ta electrode 2 are exposed, anodic oxidation is used to form TaOx layer 17, as shown in FIG. 5(c). After this, by applying a Cr electrode 18, an MIM element is formed by the structure comprising Ta electrode 2, TaOx layer 17 and Cr electrode 18, as shown in FIG. 6(a). After this, second conductor layer 19, is formed, as shown in FIG. 6(b). Subsequently, the photoresist is removed and an element is formed by means of Ta electrode 2, TaOx layer 17 and conductor 19, as shown in FIG. 6(c). If controlling the film thickness distribution of second conductor 19 provides appropriate accuracy, adjustments may be made to the thickness of second conductor layer 19.

Figure 7A:
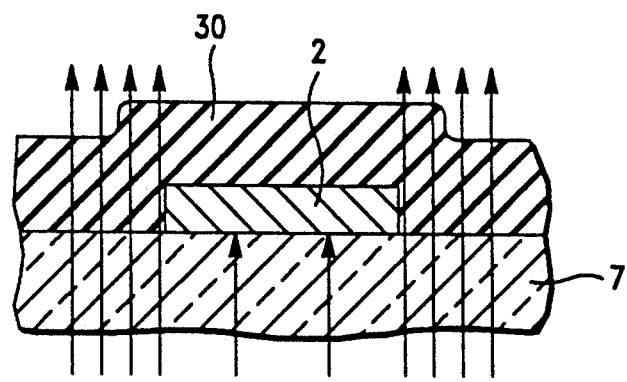
FIGS. 7(a)-(c) show an embodiment that uses positive photoresist as the barrier layer.
Figure 7B:
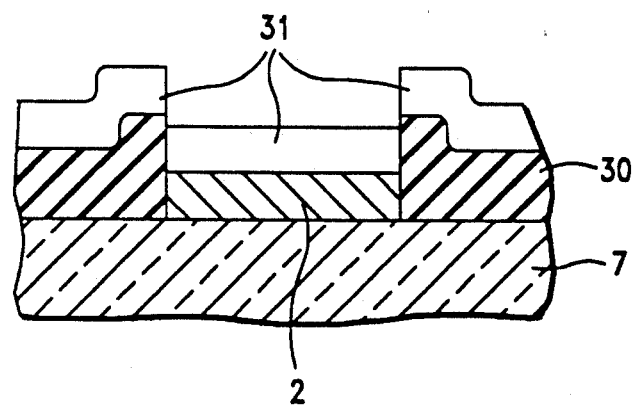
Figure 7C:
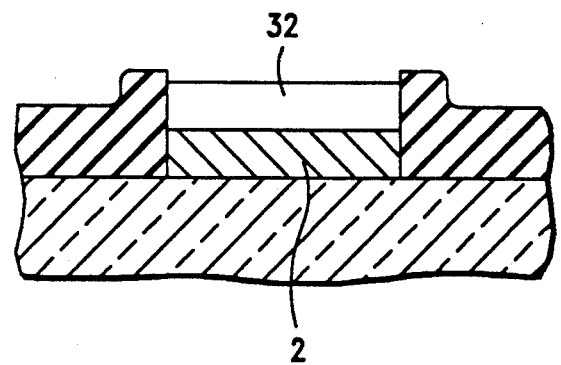
Figure 8:
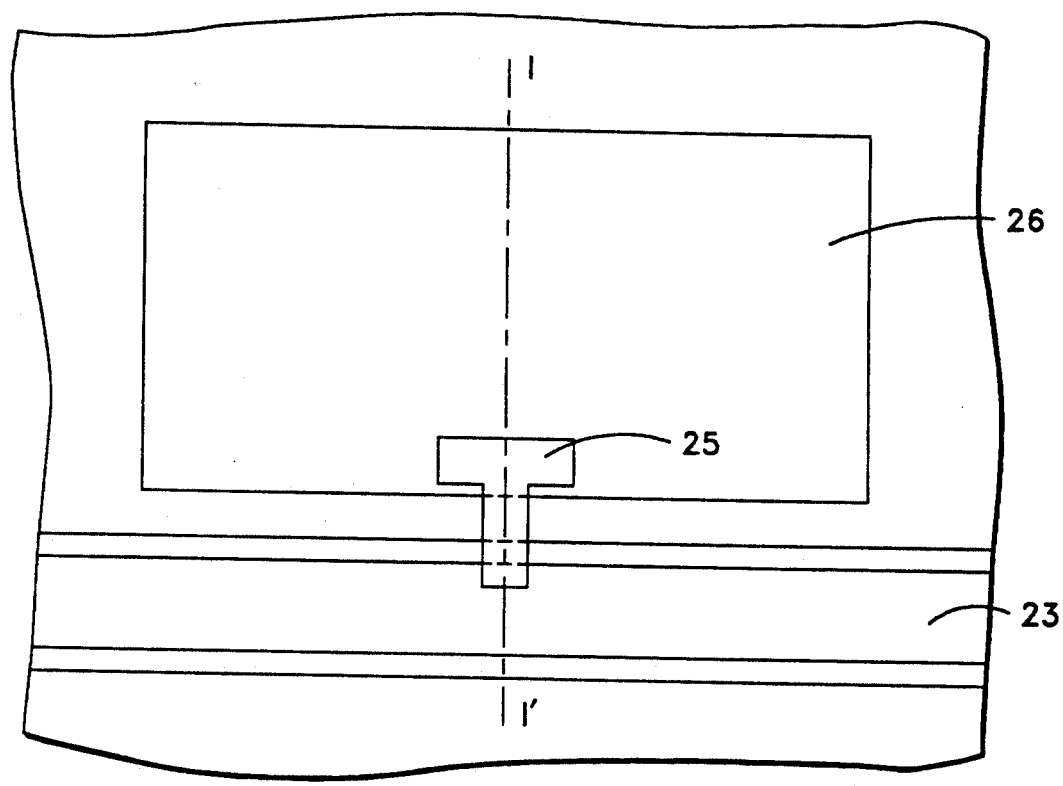
FIG. 8 shows a top view of the liquid crystal display device lateral MIM device of the prior art.
Figure 9:
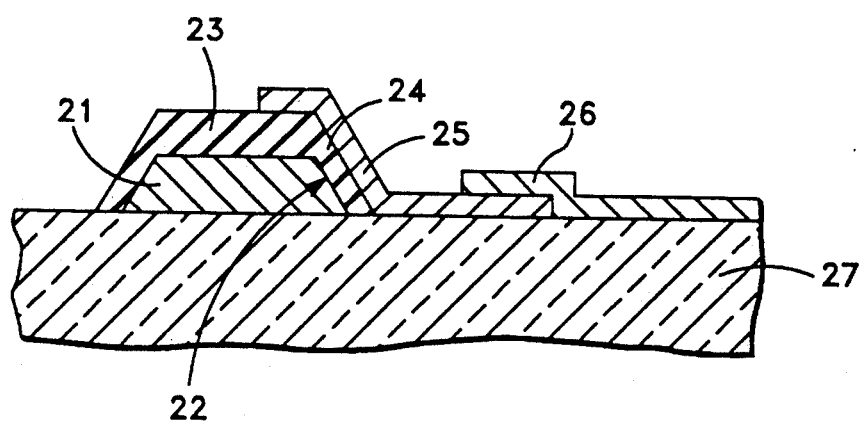
FIG. 9 shows a cross section of the liquid crystal display device lateral MIM device of the prior art.

FIGS. 7(a)-(c) show an embodiment of the present invention using negative photoresist. As indicated in FIG. 7(a), negative photoresist 30 is spread substantially evenly over Ta electrode 2. After this, light exposure takes place from the substrate backside and photoresist will remain on areas other than Ta electrode 2. After the photoresist is developed, insulation layer 31 is formed through a means such as sputtering, as shown in FIG. 7(b). When the photoresist is subsequently removed, the same shape as that shown in FIG. 5(b) will be obtained. Also, if anodic oxidation is used to form a film on Ta electrode 2, insulation layer 32 will be formed on Ta electrode 2, as shown in FIG. 7(c). After this, the photoresist should be removed.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A method of producing a lateral MIM device on a transparent substrate comprising the steps of:
   a) forming a first conductive layer on said transparent substrate;
   b) etching said first conductive layer to form a plurality of first conductive elements, said first conductive elements having tapered sidewalls;
   c) forming a first transparent insulator layer over said first conductive elements, said first insulator layer having a first predetermined thickness;
   d) applying a layer of photoresist over said insulating layer;
   e) exposing said photoresist by introducing light from the backside of said transparent substrate and developing said photoresist;
   f) etching said transparent insulator until said tapered sidewalls of said first conductive elements are exposed;
   g) forming a second insulation layer having a second predetermined thickness, on the sides of said first conductive elements to produce a conductor-insulator stack; and
   h) forming a second conductive element over said conductor-insulator stack to produce a conductor-insulator-conductor stack;

wherein said second predetermined thickness is less than said first predetermined thickness 2. The method of claim 1 wherein said first conductive layer is comprised of tantalum.

3. The method of claim 1 wherein said photoresist is positive photoresist.

4. The method of claim 1 wherein said insulator layer is TaOx.

5. The method of claim 1 wherein said second conductive element is Cr.

6. The method of claim 1 wherein said insulator layer is formed by deposition.

7. The method of claim 1 wherein said insulator is formed by thermal oxidation.

8. The method of claim 1 wherein said insulator is formed by anodic oxidation.

9. The method of claim 1 wherein said tapered sidewalls are formed to have a slope of approximately 30 degrees.

10. The method of claim 9 wherein said first predetermined thickness is approximately 3,000 Å.

11. The method of claim 10 wherein said second predetermined thickness is approximately 600 Å.

12. A method of producing a lateral MIM device on a transparent substrate comprising the steps of:
   a) forming a first conductive layer on said transparent substrate;
   b) patterning said first conductive layer to form a plurality of first conductive elements, said first conductive elements having tapered sidewalls;
   c) forming a positive sensitivity insulator layer having a first predetermined thickness, over said first conductive elements;
   d) exposing said positive sensitivity insulator by introducing light from the backside of said transparent substrate;
   e) developing said positive sensitivity insulator so that said insulator remains only on top of said first conductive elements, leaving free its sides;
   f) oxidizing said free sides by means of anodic oxidation to produce thin insulation regions having a second predetermined thickness and
   g) forming a second conductive layer over said thin insulation regions;

wherein said second predetermined thickness is less than said first predetermined thickness;

13. The method of claim 12 wherein said positive sensitivity insulator is polyimide.

14. The method of claim 9 wherein said tapered sidewalls are formed to have a slope of approximately 30 degrees.

15. The method of claim 14 wherein said first predetermined thickness is approximately 3,000 Å, and said second predetermined thickness is approximately 600 Å.

16. A method of producing a core structure for a lateral MIM device comprising a first conductor and a thick insulator on a transparent substrate comprising the steps of:
   a) forming a first conductive layer on said transparent substrate;
   b) patterning said first conductive layer to form a plurality of first conductive elements;
   c) spreading a substantially even layer of negative photoresist over said transparent substrate and said first conductive elements formed thereon;
   d) exposing said photoresist through the backside of said substrate,
   e) developing said negative photoresist;
   f) forming a thick insulation layer on top of said first conductive elements; and
   g) stripping said negative photoresist.

17. The method of claim 16 wherein the step of forming said thick insulator comprises anodic oxidation.

18. The method of claim 16 wherein the step of forming said thick insulator comprises sputtering.

19. The method of claim 16 wherein said step of forming a thick insulation layer comprises sputtering an insulating material.

20. The method of claim 16 wherein said step of forming a thick insulation layer comprises anodic oxidation.

* * * * *